United States Patent
Yoshida et al.

(10) Patent No.: US 6,506,508 B1
(45) Date of Patent: Jan. 14, 2003

(54) MAGNETIC RECORDING MEDIUM, METHOD OF PRODUCTION AND MAGNETIC STORAGE APPARATUS

(75) Inventors: Yuki Yoshida, Kawasaki (JP); Iwao Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/666,573

(22) Filed: Sep. 21, 2000

(30) Foreign Application Priority Data

Dec. 28, 1999 (JP) .............................. 11-374346

(51) Int. Cl.$^7$ .............................. G11B 5/66; G11B 5/70; C23C 14/34
(52) U.S. Cl. .................... 428/694 TS; 428/694 TM; 428/212; 428/900; 204/192.1; 204/192.2
(58) Field of Search .................... 428/694 TS, 694 TM, 428/900, 212; 204/192.1, 192.2, 192.12; 360/313, 97.01, 135

(56) References Cited

U.S. PATENT DOCUMENTS

| | | | | |
|---|---|---|---|---|
| 5,147,732 A | * | 9/1992 | Shiroishi et al. ............ 428/668 |
| 5,763,071 A | * | 6/1998 | Chen et al. ................. 428/332 |
| 6,020,060 A | * | 2/2000 | Yoshida et al. ............. 428/332 |
| 6,143,388 A | * | 11/2000 | Bian et al. ................. 428/65.3 |
| 6,150,016 A | * | 11/2000 | Song et al. ................. 428/332 |

FOREIGN PATENT DOCUMENTS

| | | |
|---|---|---|
| JP | 7-50008 | 2/1995 |
| JP | 8-329444 | 12/1996 |
| JP | 11-96534 | 4/1999 |

* cited by examiner

*Primary Examiner*—Holly C. Rickman
(74) *Attorney, Agent, or Firm*—Greer, Burns & Crain, Ltd.

(57) ABSTRACT

In a magnetic recording medium including an underlayer made of an anti-ferromagnetic material and a magnetic recording layer made of a material containing cobalt as the principal component that are serially disposed on a non-magnetic substrate, an intermediate layer made of a ferromagnetic material is sandwiched between the underlayer and the magnetic recording layer. A magnetic recording medium capable of providing an improved S/N ratio and high-density recording is provided. A production method for such a magnetic recording medium and a magnetic storage apparatus using the same are also provided.

12 Claims, 6 Drawing Sheets

MAGNETIC RECORDING MEDIUM, METHOD OF PRODUCTION AND MAGNETIC STORAGE APPARATUS

BACKGROUND OF THE INVENTION

1. Field of the Invention

This invention relates to a magnetic recording medium used for writing and reading information. More particularly, this invention relates to a magnetic recording medium that has an improved crystallinity of a magnetic recording layer to improve an S/N ratio, and has an improved thermal stability to provide high-density recording. The present invention relates further to a production method of such a magnetic recording medium and a magnetic storage apparatus using the magnetic recording medium, particularly a magnetic disk apparatus.

2. Description of the Related Art

The requirement for high-density recording has increased in magnetic disk apparatuses, used for external storage for computers, with the development of information processing technologies. Speaking more concretely, a magneto-resistive head using a magneto-resistive element, the electric resistance of which changes in accordance with the intensity of a magnetic field, that is, an MR head (Magneto-Resistive) head has been used recently in place of a conventional wired type of inductive thin film magnetic head. The MR head utilizes the magneto-resistance effect, that is, the change of the electric resistance of a magnetic substance due to an external magnetic field, for reading signals on a recording medium. The MR head has features in that it can provide an extremely greater reading output width than conventional inductive thin film magnetic heads, its inductance is small and a large S/N ratio can be expected. An AMR (Anisotropic Magneto-Resistive) head utilizing an anisotropic magneto-resistance effect, a GMR (Giant Magneto-Resistive) head utilizing a giant magneto-resistance effect and a spin valve GMR, as a practical type of GMR, have been used as MR heads.

To satisfy the requirement for high-density recording, further, the improvement of characteristics capable of coping with the MR head, the AMR head or the GMR head (inclusive of the spin valve head) has been required from the magnetic recording medium used for writing and reading the information in the magnetic disk apparatus, too. In other words, a magnetic recording medium having a low noise but a high S/N ratio and capable of high-density recording has been required.

Conventional magnetic recording media have generally been produced by forming an underlayer from chromium or its alloys on a non-magnetic substrate such as an aluminum substrate, and then forming a magnetic recording layer from an alloy containing cobalt as its principal component, such as a CoCrTa alloy or a CoCrPt alloy, on the underlayer. In such recording media, the (11–20) plane of the recording layer grows in parallel with the (002) plane of the Cr type layer used as the underlayer due to coincidence of the lattice gap. In consequence, the magnetic recording layer (Co type layer) has in-plane anisotropy, and can improve the in-plane write characteristics. However, the Co type layer (which will be called the "initial stage magnetic recording layer" or the "initial growth layer" in this specification) formed at the initial stage of the film formation has low crystallinity and results in a low S/N ratio.

To improve the crystallinity of the initial stage magnetic recording layer, Japanese Unexamined Patent Publication (Kokai) No. 8-329444 discloses a magnetic recording medium characterized in that an intermediate layer comprising a cobalt alloy having a hcp structure is sandwiched between a cobalt magnetic layer on a non-magnetic substrate and an underlayer comprising cobalt as the principal component in a magnetic recording medium having the magnetic layer on the non-magnetic substrate. In this magnetic recording medium, the non-magnetic hcp-Co type layer is allowed to grow as the initial stage magnetic recording layer to improve the crystallinity of the Co magnetic layer grown on the hcp-Co type layer.

Another method is based on the technical concept that it is effective, for lowering the noise level of magnetic recording media, to reduce the magnetic particle size to a very small size, to make the particle size uniform and to cut off the magnetic interaction among the magnetic particles. This method adds a suitable additive on the basis of this concept. For example, in a magnetic recording medium comprising a non-magnetic metal underlayer, a magnetic layer and a protective layer that are disposed on a non-magnetic substrate layer, Japanese Unexamined Patent Publication (Kokai) No. 7-50008 describes a magnetic recording medium wherein the magnetic layer comprises 60 to 80 at% of Co, 5 to 20 at% of Cr, 1 to 20 at% of Pt and 0.5 to 6 at% of at least one of Nb, Hf, W, Ti and Ta. In other words, this magnetic recording medium attempts to attain a low noise by adding at least one of Nb, Hf, W, Ti and Ta to the magnetic layer. In such a recording medium, however, thermal unstability of recording magnetization, that results from the decrease of the magnetic particle size and reduction of the magnetic interaction among the magnetic particles, becomes a new problem.

The conventional technologies explained above may be summarized as follows. In order to accomplish high-density recording and a low noise level in a magnetic recording medium, it is essentially necessary to reduce the sizes of the magnetic particles in the magnetic recording layer, to make the particle sizes uniform and to reduce the magnetic interaction among the magnetic particles. However, recording magnetization becomes unavoidably unstable in this case, and measures must be taken to secure thermal stability of recording magnetization.

SUMMARY OF THE INVENTION

The inventors of this invention have conducted intensive studies to secure thermal stability of recording magnetization. As a result, the present inventors acquired the following idea, as described in Japanese Unexamined Patent Publication (Kokai) No. 11-96534. In other words, the present inventors have invented a magnetic recording medium comprising a first underlayer made of a non-magnetic material consisting of chromium as the principal component, a second underlayer made of an anti-ferromagnetic material of a body-centered cubic structure, having a Neel temperature of at least 60° C., of the type such that when the crystal lattice of this material is compared with the crystal lattice of the body-centered cubic structure of the first underlayer, one of the sides of the lattice of the (100) plane of the former is substantially in conformity with the length of the diagonal of the lattice of the (100) plane of the latter, hence, epitaxial growth can be done on the first underlayer, and a magnetic layer made of a ferromagnetic material consisting of cobalt as the principal component, each layer being disposed serially on a non-magnetic substrate. This magnetic recording medium uses the anti-ferromagnetic material for the second underlayer keeping contact with the magnetic layer. Consequently, this medium provides improved thermal stability by utilizing the exchange interaction between the anti-ferromagnetic underlayer and the ferromagnetic magnetic layer.

In this magnetic recording medium, however, the anti-ferromagnetic underlayer and the ferromagnetic magnetic layer must be in direct contact with each other. Therefore, the improvement of crystallinity and a high S/N ratio cannot be accomplished simultaneously by employing the initial stage growth layer (the magnetic recording layer of the initial stage) having the hcp structure that is described in Japanese Unexamined Patent Publication (Kokai) No. 8-329444 described already.

The present invention is therefore directed to solve the problems of the prior art technologies described above. It is the first object of the present invention to provide a magnetic recording medium that can simutaneously provide an improvement in the S/N ratio and the thermal stability of recording magnetization, and is suitable for high-density recording.

It is the second object of the present invention to provide a production method of such an excellent magnetic recording medium.

It is the third object of the present invention to provide a magnetic storage apparatus using the magnetic recording medium of the present invention.

The above and other objects of the present invention will be easily understood from the following detailed explanation.

According to one aspect of the present invention, there is provided a magnetic recording medium including an underlayer made of an anti-ferromagnetic material, and a magnetic recording layer made of a magnetic material consisting of cabalt as the principal component, that are disposed serially on a non-magnetic substrate, wherein an intermediate layer made of a ferromagnetic material is further sandwiched between the underlayer and the magnetic recording layer.

According to another aspect of the present invention, there is provided a method of producing a magnetic recording medium including an underlayer and a magnetic layer on a non-magnetic substrate, which method comprises forming the underlayer from an anti-ferromagnetic material on the non-magnetic substrate, forming the intermediate layer from a ferromagnetic material, and forming the magnetic recording layer from a magnetic material consisting of cobalt as the principal component on the intermediate layer, whereby each of these layers is formed by sputtering.

According to still another object of the present invention, there is provided a magnetic storage apparatus including a write head portion for writing information and a read head portion for reading information in a magnetic recording medium, wherein the magnetic recording medium is a magnetic recording medium including an underlayer made of an anti-ferromagnetic material, an intermediate layer made of a ferromagnetic material and a magnetic recording layer made of a magnetic material consisting of cobalt as the principal component that are serially disposed on a non-magnetic substrate, wherein the write head portion is equipped with a magneto-resistive head.

DESCRIPTION OF THE PREFERRED EMBODIMENTS

Figure 1:
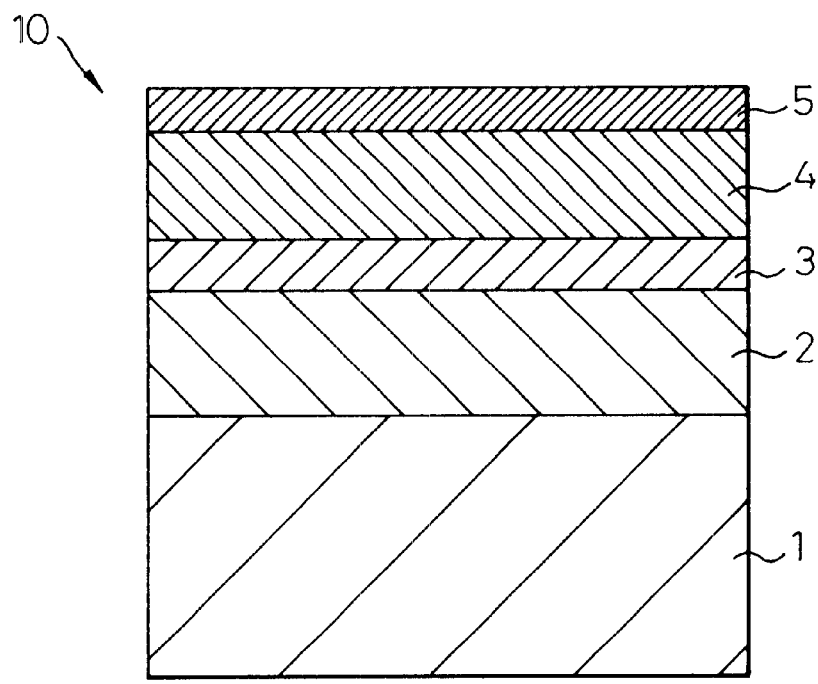
FIG. 1 is a sectional view showing a magnetic recording medium according to a preferred embodiment of the present invention.

In a magnetic recording medium including an underlayer, an intermediate layer and a magnetic recording layer made of a magnetic material containing cobalt as the principal component that are disposed in sequence on a non-magnetic substrate, the present invention uses an anti-ferromagnetic material as the underlayer and a ferromagnetic material having preferably an hcp structure for the intermediate layer, and can provide a magnetic recording medium having high thermal stability and good recording characteristics, as will be explained later in further detail. That is, the inventors of this invention have invented the present invention based on the findings that, although the ferromagnetic magnetic layer must essentially be in direct contact with the anti-ferromagnetic underlayer to improve thermal stability on the basis of the exchange interaction according to the prior art technologies, the ferromagnetic intermediate layer can eliminate this prior condition and makes it possible to employ the initial growth layer. The present invention is completed on the basis of this discovery.

In the layer structure in the magnetic recording medium of the present invention, the intermediate layer is made of the ferromagnetic material that allows control of the cyrstallinity, the crystal orientation, the grain size, etc, of the magnetic layer above it, and can improve the S/N ratio.

Since the intermediate layer used in the magnetic recording medium of the present invention is magnetic, it can magnetically couple with the magnetic layer above it. Since the anti-ferromagnetic layer as the underlayer of the intermediate layer is in direct contact with the intermediate layer, the exchange interaction can take place between magnetization of the respective layers. Due to this exchange interaction, the magnetic anisotropy energy Ku of the magnetic particles constituting the intermediate layer apparently increases, so that magnetization of the intermediate layer and magnetization of the magnetic layer coupling magnetically with the intermediate layer become thermally stable. In consequence, the magnetic recording medium according to the present invention has a high S/N ratio and moreover, is thermally stable and can keep recording information for a long time.

When the intermediate layer is used as the initial growth layer of the magnetic layer, or in other words, when the portions of the initial magnetic layer having low crystallinity are replaced by the intermediate layer, in the magnetic recording medium of the present invention, strong magnetism of the intermediate layer, if it exists, will result in noise. Therefore, when a intermediate layer having low magnetism is used, the noise can be reduced. Here, the term "low magnetism" can be explained by a small Mr·t value where Mr is residual magnetization of the magnetic layer and t is the thickness of the magnetic layer. When orientation control and grain size control of the magnetic layer are conducted after the coercive force of the intermediate layer is brought into conformity with that of the magnetic layer, an intermediate layer having high magnetism can be effectively used.

Hereinafter, the magnetic recording medium according to the present invention and the production method thereof will be explained referring to preferred embodiments thereof.

FIG. 1 is a sectional view showing a magnetic recording medium according to a preferred embodiment 1 of the present invention. The magnetic recording medium 10 of the present invention comprises an underlayer 2 made of an anti-ferromagnetic material, an intermediate layer 3 made of a ferromagnetic material and a magnetic recording layer 4 made of a magnetic material containing cobalt as the principal component that are serially formed on and over a non-magnetic substrate 1 as shown in FIG. 1. A protective layer 5 is disposed on the magnetic recording layer 4 for protecting the medium.

The non-magnetic substrate used as the substrate in the magnetic recording medium of the present invention may be made of various customary substrate materials used in this field of technology. Examples include a Nip-plated aluminum (inclusive of an aluminum alloy) disk, a glass disk or a reinforced glass disk, a silicon disk having a surface oxide film (e.g. silicon oxide film), a SiC disk, a carbon disk, a plastic disk, a ceramic disk, and so forth. These substrates may be subjected to the texture treatment that is ordinarily carried out in this technical field. The sizes of the substrates and thicknesses can be changed over a broad range in accordance with factors such as the kind of the desired media and the magnetic storage apparatus using the substrates. Generally, the size is from about 150 to about 16,000 mm$^2$ and the thickness is from about 0.5 to about 1.2 mm, though these values are in no way restrictive.

The underlayer oh the non-magnetic substrate is made of an anti-ferromagnetic material. Various kinds of anti-ferromagnetic materials can be used for forming this underlayer. Preferred are those materials which have the crystal lattice size and orientation necessary for laying the c axis of the hcp layer of the upper layer inside the film plane, and which have a Neel temperature higher than the operation temperature of the apparatus. Preferred examples of the anti-ferromagnetic material are Cr type alloys comprising chromium (Cr) as the principal component and at least one additional element selected from manganese (Mn), ruthenium (Ru) and rhenium (Re), such as CrMn, though they are not restrictive. When such a Cr type alloy is used, it can operate as the anti-ferromagnetic material because the Neel temperature as the anti-ferromagnetic material is higher than the operation temperature of the magnetic storage apparatus. It can also promote the epitaxial growth of the intermediate layer having the hcp structure.

The Cr type alloy described above may contain, whenever necessary, at least one kind of element selected from the group consisting of molybdenum (Mo), titanium (Ti), platinum (Pt), vanadium (V) and tungsten (W) in addition to Mn, Ru and Re. Examples of such Cr type alloys include CrMoMn, CrMnPt and CrMoWMn. Particularly preferred are CrMoMn and CrMnPt.

In the present invention, NiO, too, can be used advantageously for forming the underlayer in place of the Cr type alloys described above. In this case, too, it has a high Neel temperature and provides good lattice matching with the hcp intermediate layer.

The underlayer is used generally as the single layer. However, it may be used in a multi-layered structure of two or more layers, whenever necessary, because the functions of such underlayers can be separately used, and more excellent magnetic characteristics and other effects can be obtained due to the synergistic effects of the respective layers. Examples of the underlayers having the multi-layered structure are Cr/CrMn, CrMo/CrMn, CrMoW/CrMn, and so forth. An underlayer having good crystal orientation or having a very fine particle size is used as the lower underlayer (or, the first underlayer), and an underlayer providing an excellent effect as the anti-ferromagnetic layer is used as the upper underlayer (or the second underlayer). When such a layer structure is used, the second underlayer and the magnetic intermediate layer are in direct contact with each other. Consequently, the exchange interaction operates between them, and orientation and the particle size can be controlled through the first underlayer.

The underlayer described above can be formed under a customary film formation condition by a sputtering process such as magnetron sputtering. A suitable film formation condition is, for example, a film formation temperature of about 150 to about 350° C., an Ar gas pressure of about 1 to about 10 mTorr, and a bias voltage of about 0 to –400 V. If the film formation temperature is too low, the film formation process does not proceed smoothly, and if it is too high, on the contrary, distortion of the substrate occurs. This also holds true of the subsequent film formation process. Other film formation methods such as vacuum deposition, ion beam sputtering, etc, may be used, whenever necessary, in place of sputtering.

The film thickness of the underlayer can be changed over a broad range in accordance with the structure and the composition of the underlayer. Preferably, it is generally not greater than 100 nm and, further preferably, is within the range of 1 to 50 nm. When the film thickness of the underlayer exceeds 100 nm, an increase in the crystal grain size and deterioration of the surface properties may occur.

It is an essential requirement in the magnetic recording medium of the present invention that the intermediate layer is sandwiched between the underlayer and the magnetic recording layer. The intermediate layer bears the initial growth layer of the magnetic layer and is, in a sense, a part of the magnetic layer on it. Fundamentally, however, the intermediate layer used in the present invention is the intermediate layer. Therefore, it is not involved with the write and read operations, or even if it is, it exhibits only a slight influence. Therefore, the intermediate layer is preferably made of a ferromagnetic material having the hcp structure.

The intermediate layer preferably has "weak magnetism". In other words, even when the intermediate layer has magnetism, its saturation magnetization is preferably smaller than saturation magnetization of the magnetic recording layer. Accordingly, the intermediate layer has magnetism but cannot easily participate in the write and read operations.

A suitable example of the material for forming the intermediate layer is an alloy comprising cobalt (Co) and chromium (Cr) as the principal components. Concrete examples are CoCr type alloys such as CoCr and CoCrTa. When such a CoCr type alloy is used for the intermediate layer, magnetism can be controlled by the operation of Cr, and lattice matching with the Co type magnetic layer above the intermediate layer is excellent, too. Incidentally, the Cr concentration in the Co ferromagnetic particles is preferably up to 22 at%, or the mean concentration in the CoCr type alloy is preferably less than 37 at% and more preferably, within the range of 30 to 35 at% because the material loses its magnetism beyond the upper limits described above.

The intermediate layer made of the CoCr type alloy having the hcp structure has magnetism. Therefore, the exchange interaction occurs between the intermediate layer and the underlayer, and recording magnetization of the upper magnetic layer can be stabilized thermally. Furthermore, since magnetism is low, it does not result in an increase of the noise and can rather eliminate the initial layer of the magnetic layer having low crystallinity that would otherwise result in the noise. Consequently, the intermediate layer can reduce the noise.

Though the intermediate layer is generally used as a single layer, it may be used in the multi-layered structure of two or more layers, whenever necessary. An example of the intermediate layer having the multi-layered structure is CoCr (having low magnetism)/CoCrTa (having high magnetism). In other words, the CoCr alloy of the lower intermediate layer (or the first intermediate layer) is caused to play the role of the crystal growth layer of the initial stage, and the CoCrTa alloy of the upper intermediate layer (or the second intermediate layer) is caused to play the role of causing in-plane orientation of the c axis of the hcp magnetic layer. When such a layer structure is employed, a magnetic recording medium having both excellent crystallinity and in-plane orientation can be obtained.

The intermediate layer can be formed under a customary film formation condition by a sputtering process such as magnetron sputtering. For example, a suitable film formation condition is a film formation temperature of about 150 to about 350° C., an Ar gas pressure of about 1 to about 10 mTorr and a bias voltage of about 0 to about −400 V, for example. Other film formation methods such as vacuum deposition, ion beam sputtering, etc, can be employed in place of sputtering, whenever necessary.

The film thickness of the intermediate layer can be changed over a broad range in accordance with its structure and composition. Generally, the film thickness is not more than 50 nm, and is preferably 50 nm or below even when the thickness is combined with the thickness of the overlying magnetic recording layer. For, when the film thickness of the magnetic recording layer (inclusive of the intermediate layer) increases, resolution of the write/read characteristics (RW characteristics) may get deteriorated.

The magnetic recording layer in direct contact with the intermediate layer, as described above, is made of a Co type magnetic material. Examples of such materials are Co type binary alloys such as a CoPt alloy, a CoNi alloy and a CoCr alloy, Co type ternary alloys such as CoCrPt and CoCrTa, and quaternary and quinary alloys prepared by adding Ta, Nb, B or Mo to the CoCrPt alloy, such as CoCrPtTa, CoCrPtB, CoCrPtTaNb, CoCrPtTaMo and CoCrPtTaB. These examples are not restrictive in any way. These Co type alloys are effective for lowering the noise of the medium.

When the Co type alloy such as CoCrPtB, that permits the c axis to easily orient vertically relative to its surface, is used to form the magnetic recording layer, CoCrPtTa, or the like, that easily undergoes in-plane orientation, is used for the intermediate layer as the base, and in-plane orientation of the magnetic recording layer can be improved. In this case, the intermediate layer is made of the material having low magnetism or the material that, though having high magnetism, can make its magnetostatic characteristics such as its coercive force substantially equal to those of the magnetic layer. In this way, the increase of the noise can be restricted.

One composition example of the Co type alloy that is useful as the magnetic material for executing the present invention is as follows.

cobalt: 56 to 78 at%, chromium: 14 to 25 at%, platinum: 4 to 20 at%, and tantalum and/or niobium: 0.5 to 4 at%.

Such a magnetic recording layer can be formed advantageously by sputtering. under a specific film formation condition. Magnetron sputtering can be used as the sputtering method in the same way as in the formation of the underlayer and the intermediate layer on the former as described above. A suitable film formation condition is, for example, a film formation temperature of about 150 to 350° C., an Ar gas pressure of about 1 to about 10 mTorr and a bias voltage of about 0 to about- 400 V It has been found that a film formation temperature of about 150 to about 350° C. is preferable for segregation of Cr and for the crystal growth. Other film formation methods such as vacuum deposition, ion beam sputtering, and the like, can be used in place of sputtering, whenever necessary.

In the magnetic recording medium of the present invention, the film thickness of the magnetic recording layer can be changed over a broad range in accordance with factors such as the composition of the Co type alloy used for forming the magnetic layer, the desired characteristics, and the composition and film thickness of the intermediate layer as the base. However, its total film thickness with the intermediate layer is preferably 100 nm or below, more preferably 50 nm or below. To avoid deterioration of the resolution of the RW characteristics, the film thickness is advantageously not greater than 50 nm.

The magnetic recording layer generally comprises a single film. However, it may comprise a film having a multi-layered structure of two or more layers that are mutually separated. In such a case, each magnetic layer may be the same or different and can be separated from each other through a non-magnetic intermediate film. An example of a suitable non-magnetic intermediate film is a CrMo layer.

The magnetic recording medium according to the present invention may further include a protective layer, that is customary in this technical field, as its uppermost layer. Suitable examples of the protective layer are a layer of carbon alone or its compounds, such as a C layer, a WC layer, a SiC layer, a $B_4C$ layer, a hydrogen-containing C layer, and a diamond-like carbon (DLC) layer. The present invention can use particularly advantageously the protective layer of DLC because it has excellent wear resistance. Such a protective layer can be formed in a customary manner by sputtering or vacuum deposition. The film thickness of the protective layer can be changed over a broad range in accordance with various factors, and is preferably about 3 to about 10 nm.

In addition to the essential layers and the layers that can be arbitrarily as described above, the magnetic recording medium according to the present invention may include additional layers that are customary in this technical field, or arbitrary chemical treatment may be applied to the layers contained in the magnetic recording medium. For example, a lubrication layer of a fluorocarbon resin type may be disposed on the protective layer described above.

Figure 2:
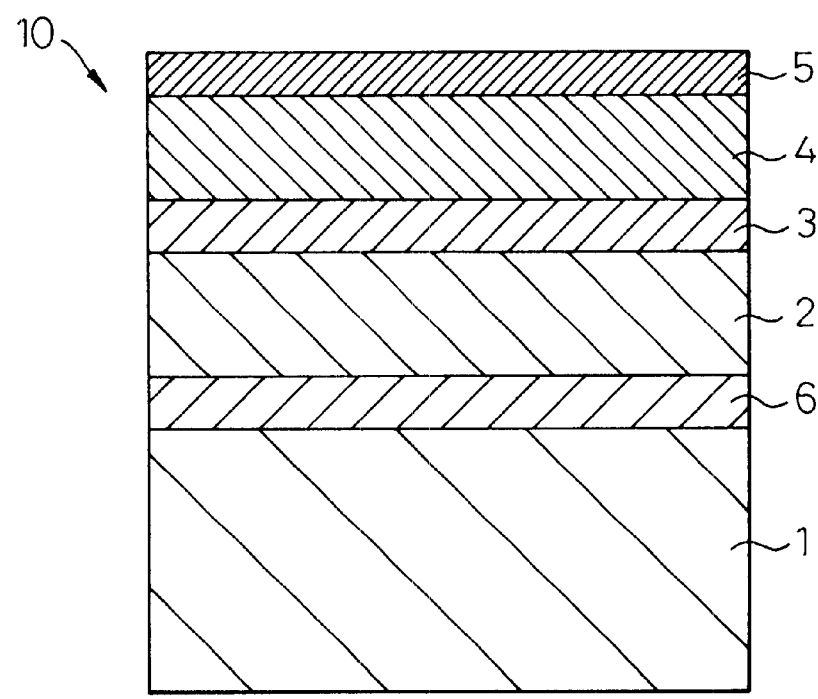
FIG. 2 is a sectional view showing a magnetic recording medium according to another preferred embodiment of the present invention.

According to another preferred embodiment of the present invention, the magnetic recording medium of the present invention can further include one or more seed layers between the non-magnetic substrate and the underlayer. FIG. 2 shows an example where a single seed layer 6 is sandwiched between the non-magnetic substrate 1 of the magnetic recording medium 10 shown in FIG. 1 and its underlayer 2.

Various seed layers that are customary in the magnetic recording medium can be used. Typical examples of the seed layers are listed below.

FCC:

FCC is prepared from Cr alone, or by adding at least one of W, Mo, Ti, V and Mn to Cr.

Amorphous seed:

An amorphous seed is formed from NiP, Ta, CrP, CuP, FeP, WSi, W or Zr. These materials improve crystallinity of the nonmagnetic substrate and the growth of the underlayer.

B2 structure seed:

This seed is formed from NiAl, FeAl, CoTi, CuZr, TiAl, etc. When such materials are used, the particle size of the underlayer can be made fine and uniform, and crystal orientation can be controlled.

The seed layer, too, is formed preferably by a sputtering process such as magnetron sputtering, for example, under a customary film formation condition in the same way as the underlayer, the intermediate layer and the magnetic recording layer. A suitable film formation condition is, for example, a film formation temperature of about 150 to 350° C., an Ar gas pressure of about 1 to about 10 mTorr and a bias voltage of about 0 to about −400 V. Other film formation methods such as vacuum deposition, ion beam sputtering, and the like, may be used in place of sputtering, whenever necessary. Incidentally, the film thickness of the seed layer is preferably within the range that insures effective utilization of its characteristics.

According to another aspect of the present invention, there is provided a magnetic storage apparatus using the magnetic recording medium of the present invention, particularly a magnetic disk apparatus. The construction of the magnetic disk apparatus of the present invention is not particularly limited, but it is preferred that the magnetic disk apparatus is fundamentally equipped with a write head portion for writing information to the magnetic recording medium and a read head for reading the information. Particularly, the read head portion is equipped with a magneto-resistive head the electric resistance of which changes with the intensity of the magnetic field, that is, a MR head, as will be explained below.

The magnetic disk apparatus according to the present invention can preferably use a composite type magnetic head that includes a magneto-resistive type read head portion having a magneto-resistive element and a conductor layer for supplying a sense current to the magneto-resistive element, for reading the information from the magnetic recording medium, and an induction type write head portion including a pair of magnetic poles each comprising a thin film, for writing the information to the magnetic recording medium, wherein the read head portion and the write head portion are laminated with each other. The magneto-resistive read head may have various structures known in this technical field, and is preferably an AMR head utilizing the anisotropic magneto-resistance effect or a GMR head utilizing a gigantic magneto-resistance effect (inclusive of a spin valve GMR). The conductor layer of the read head portion may take various structures, and preferably has any of the following structures.

1. As to the film thickness of the conductor, the portion in the proximity of the magneto-resistive element is relatively thin and the rest of the portions are thick.
2. As to the film thickness and the width of the conductor layer, the portion in the proximity of the magneto-resistive element is relatively thin and is thinly elongated and the rest of the portions are thick and wide.

The film thickness of the conductor layer and, whenever necessary, the width, can be adjusted by various means. However, it is recommended to increase the film thickness of the conductor layer by employing a multi-layered structure.

The magnetic disk apparatus having the construction described can reduce the curve of the magnetic poles of the write head portion and can lower the resistance of the conductor layer in comparison with the conventional composite type magnetic head (comprising the combination of a magneto-resistive read head portion for reading the information and the induction type write head portion for writing the information). The magnetic disk apparatus can read the information precisely and with a high sensitivity when off-tracking remains within a small range.

Figure 3:
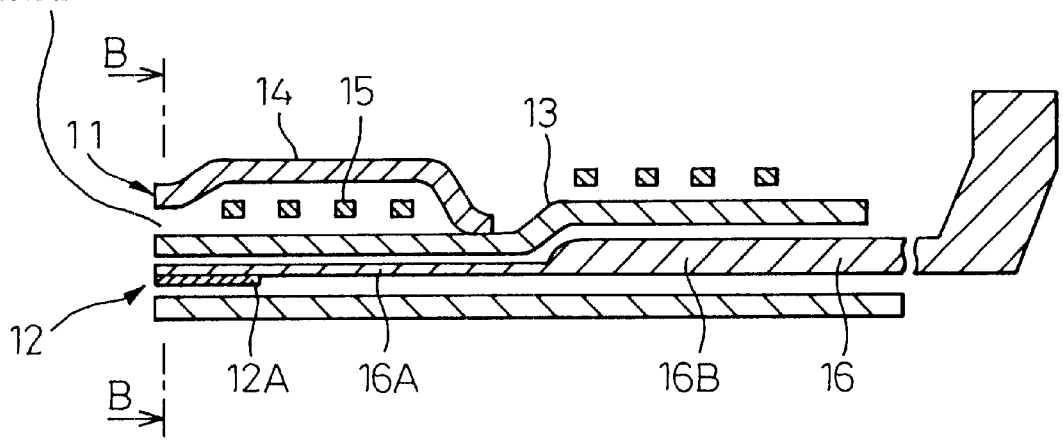
FIG. 3 is a sectional view showing the principle of a head of a magnetic disk apparatus according to the present invention.
Figure 4:
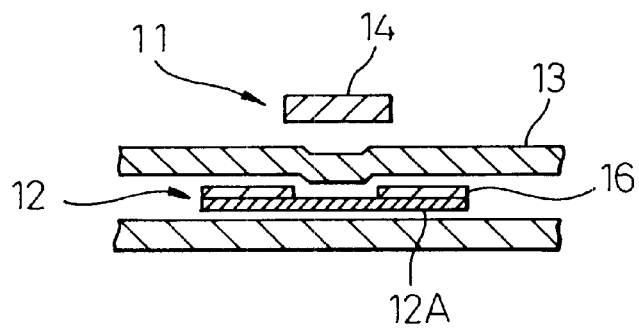
FIG. 4 is a sectional view taken along a line B—B of the head of the magnetic disk apparatus shown in FIG. 3.

In the magnetic disk apparatus according to the present invention, the write head portion and the read head portion can, preferably, have the laminate structure as shown in FIGS. 3 and 4. FIG. 3 is a schematic view showing the principle of the head of the magnetic disk apparatus according to the present invention, and FIG. 4 is a sectional view taken along line B—B of FIG. 3.

In FIGS. 3 and 4, reference numeral 11 denotes an induction type write head portion for writing the information to a magnetic recording medium. Reference numeral 12 denotes a magneto-resistive reproduction head portion for reading the information. The write head portion 11 comprises an upper magnetic pole 14 made of NiFe, etc, opposing a lower magnetic pole 13 with a predetermined gap between them, and a coil 15 for exciting these magnetic poles 13 and 14 and writing the information to the magnetic recording medium through its recording gap portion.

The read head portion 12 preferably comprises an AMR head or a GMR head. A pair of conductor layers 16 for supplying the sense current to the magneto-resistive element portion 12A is disposed on the magneto-resistive element portion 12A with a gap corresponding to the recording track width. The conductor layer 16 is formed thinly at the proximity portion 16A to the magneto-resistive element portion 12A, and the other portions 16B are formed thick.

In the construction shown in FIGS. 3 and 4, the film thickness of the conductor layer is small at the proximity portion 16A of the magneto-resistive element portion 12A, and the curve of the lower magnetic pole (upper shield layer) 13, etc, is small. For this reason, the shape of the recording gap opposing the magnetic recording medium is not very curved. Even if any positional deviation occurs between the magnetic head on the track during the write operation of the information and the magnetic head on the track during the read operation, the magnetic disk apparatus can correctly read the information and can avoid the problem of the occurrence of the read error, though the off-tracking quantity is small.

On the other hand, the conductor layer 16 is formed to a large thickness at portions 16B other than the proximity portion of the magneto-resistive element portion 12A. Therefore, the overall resistance of the conductor layer 16 can be decreased. As a result, the resistance change of the magneto-resistive element portion 12A can be detected with a high sensitivity, and the S/N ratio can be improved. Exothermy in the conductor layer 16 can be avoided and the occurrence of the noise resulting from exothermy can be avoided, too.

EXAMPLES

Figure 5:
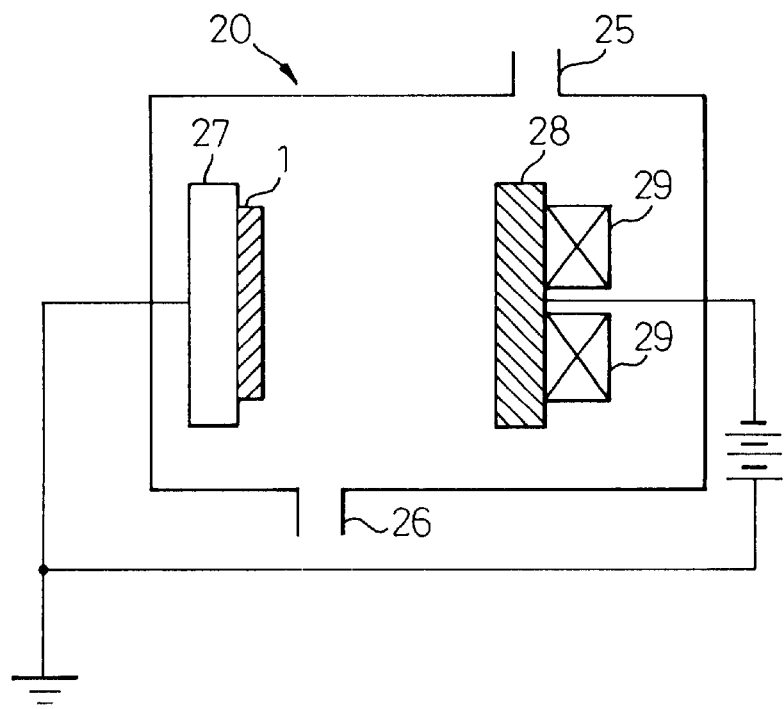
FIG. 5 is a schematic view showing the construction of a DC magnetron sputtering apparatus used for forming the magnetic recording medium according to the present invention.

Typical working examples of the present invention will be described hereinafter, however, it is to be noted that the present invention is not particularly limited thereto. Incidentally, the following examples use a DC magnetron sputtering apparatus having the construction shown in FIG. 5 to form the underlayer, the magnetic recording layer and the protective layer. As shown in this drawing, the sputter apparatus 20 includes an argon feed port 25 for introducing an argon gas into a sputtering chamber, an exhaust port 26, a susceptor 27, a target 28 and a magnet 29. A vacuum of about 1 to about 10 Torr can be applied to the sputter chamber of the apparatus.

Example 1
Production of Magnetic Recording Medium

Texture treatment was applied to a Nip-plated aluminum substrate in a circumferential direction. An underlayer made of CrMo10 (at%), a magnetic intermediate layer made of CoCr35 (at%), a magnetic recording layer made of Co74Cr17Pt5Ta4 (at%) and a DLC protective layer were serially laminated over the substrate by using a DC magnetron sputtering apparatus. In this case, the sputter chamber was evacuated to $3 \times 10^{-7}$ Torr or below before the film formation of the underlayer. The substrate temperature was raised to 240° C., the argon gas was introduced, and the sputter chamber was held at 5 mTorr. The film of the underlayer was formed to a thickness of 25 nm by using CrMo as a target and by applying a bias voltage of –200 V. Next, the argon pressure was adjusted to bring the sputter chamber to 25 mTorr, and the film of the magnetic intermediate layer was formed to a thickness of 20 nm from the CoCr target on the CrMo underlayer. The bias voltage applied during the film formation of the magnetic intermediate layer was also –200 V. Next, the sputter chamber was returned again to 5 mTorr, and a CoCrPtTa film was formed to a thickness of 30 nm from a composite target of Co, Cr, Pt and Ta. The film of the DLC protective layer as the uppermost layer was formed to a thickness of 10 nm in the same way. The coercive force (Hc), the normalized noise (Nm/Siso) and the medium S/N ratio (Siso/Nm) of the magnetic recording medium so formed were measured with the result represented by bar graphs III in FIGS. 6, 7 and 8, respectively.

Comparative Example 1

For comparison, the procedure of Example 1 was repeated with the exception that the formation of the magnetic intermediate layer was omitted. The coercive force (Hc), the normalized noise (Nm/Siso) and the medium S/N ratio (Siso/Nm) of the magnetic recording medium so produced were measured with the result represented by the bar graphs I in FIGS. 6, 7 and 8, respectively.

Comparative Example 2

For comparison, the procedure of Example 1 was repeated with the exception that a non-magnetic intermediate layer of CoCr37 (at%) was formed to the same film thickness in place of the CoCr35 (at%) magnetic intermediate layer as the intermediate layer. The coercive force (Hc), the normalized noise (Nm/Siso) and the medium S/N ratio (Siso/Nm) of the magnetic recording medium so produced were measured with the result represented by bar graphs II in FIGS. 6, 7 and 8, respectively.

Figure 6:
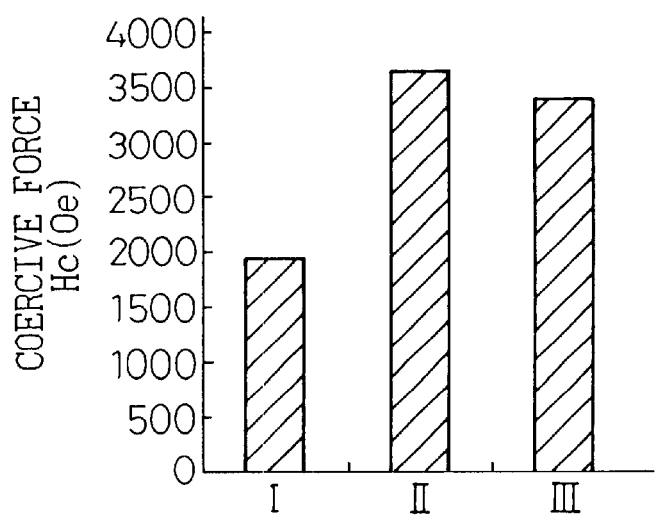
FIG. 6 is a graph showing the coercive force (Hc) of the magnetic recording media produced in the embodiments of the present invention.

It could be understood from the graph of the coercive force (Hc) shown in FIG. 6 that the CoCr35 magnetic intermediate layer had extremely low magnetism but, due to its initial growth layer improving effect, the coercive force (Hc) could be increased to a level comparable to that of the CoCr37 non-magnetic intermediate layer.

Figure 7:
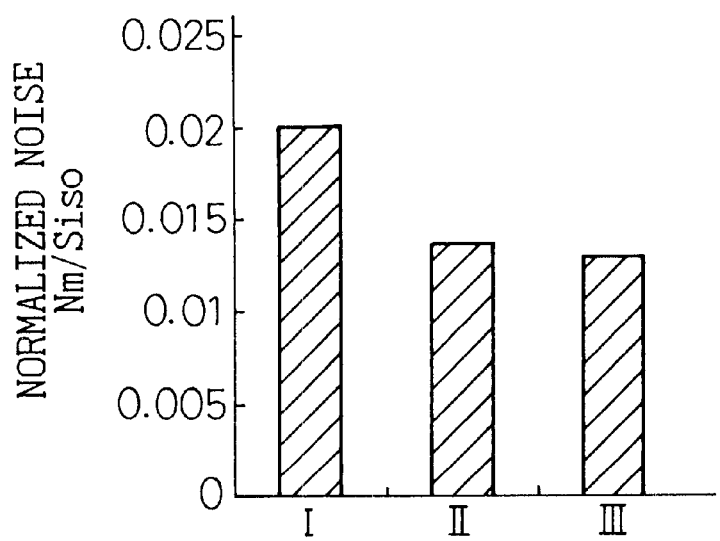
FIG. 7 is a graph showing the normalized noise (Nm/Siso) of the magnetic recording media produced in the embodiments of the present invention.
Figure 8:
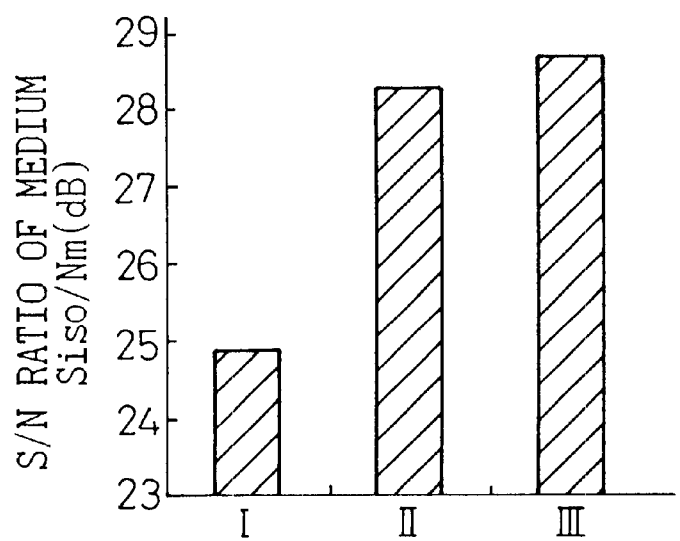
FIG. 8 is a graph showing the medium S/N ratio (Siso/Nm) of the magnetic recording media produced in the embodiments of the present invention.

It could be understood also from FIGS. 7 and 8 that even when the intermediate layer having magnetism was used, the noise reduction effect could be obtained to a level approximate to that of the non-magnetic intermediate layer.

Example 2
Magnetic Disk Apparatus

Figure 9:
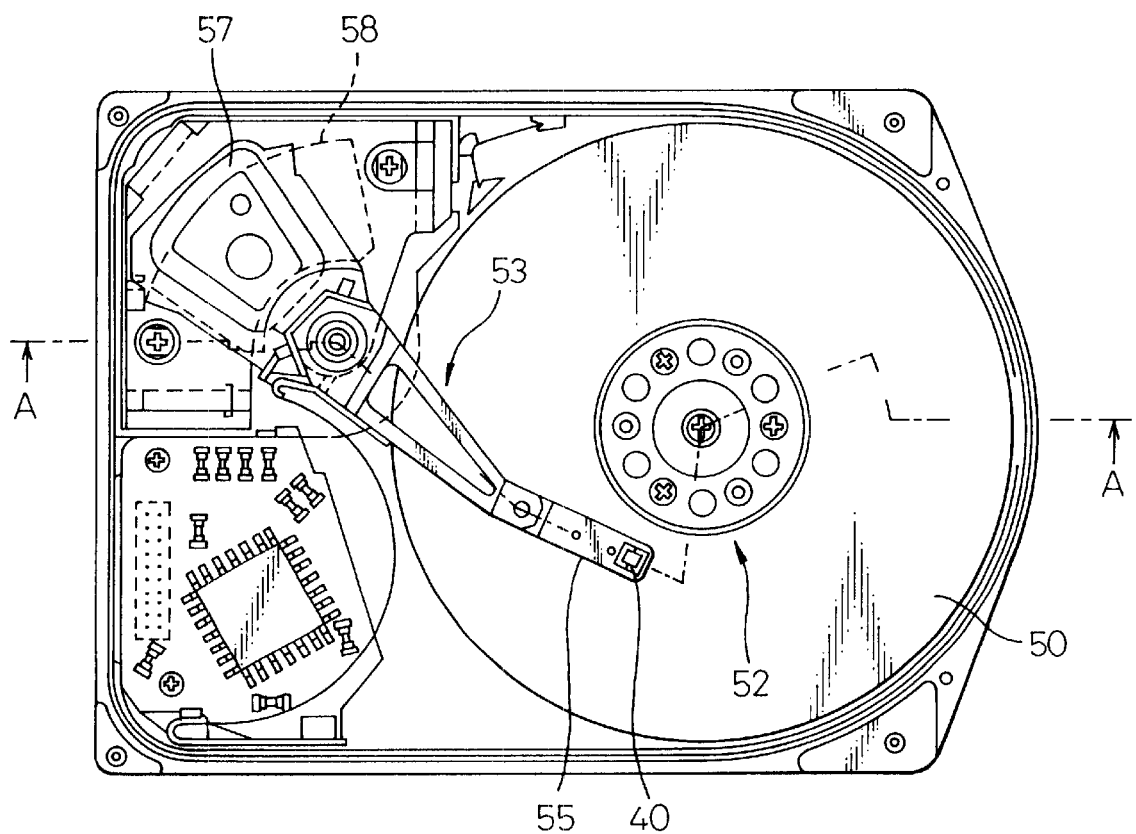
FIG. 9 is a plan view of a magnetic disk apparatus according to the present invention that uses a slider equipped with a magnetic head.
Figure 10:
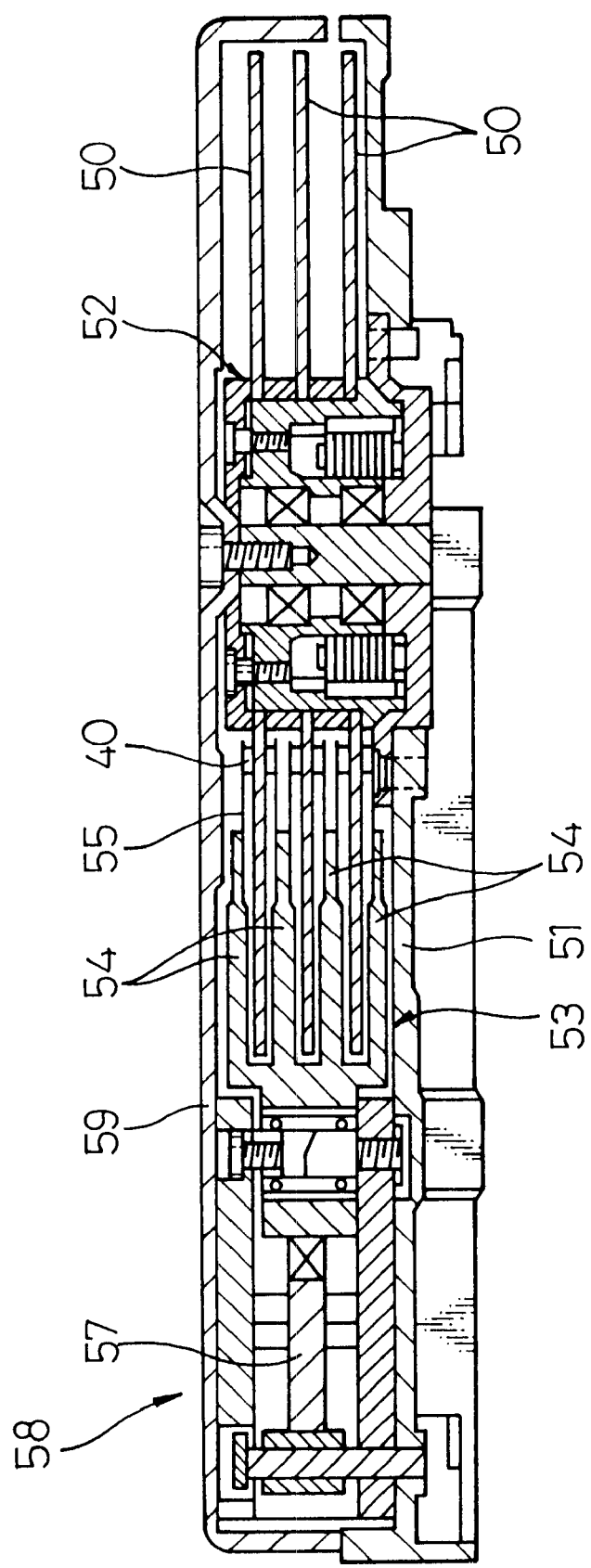
FIG. 10 is a sectional view taken along a line A—A of the magnetic disk apparatus shown in FIG. 9.

FIG. 9 is a plan view showing a preferred example of a magnetic disk apparatus according to the present invention using a slider equipped with a magnetic head (under the cover removal state), and FIG. 10 is a sectional view taken along a line A—A in FIG. 9.

In these drawings, reference numeral 50 denotes a plurality (three, in this example) of magnetic disks as the magnetic recording medium driven for rotation by a spindle motor 52 disposed on a base plate 51.

Reference numeral 53 denotes an actuator turnably disposed on the base plate 51. A plurality of head arms 54 extending in the direction of the write surface of the magnetic disks are formed at one of the turning end portions of the actuator 53. A spring arm 55 is fitted to the turning end portion of the head arms 54. A slider 40 equipped with a magnetic head is fitted to the flexure portion of the spring arm 55 in such a fashion as to be capable of tilting through an insulating film (not shown). A coil 57 is provided to the other turning end portion of the actuator 53.

A magnetic circuit 58 comprising a magnet and a yoke is disposed on the base plate 51. The coil 57 described above is disposed inside a magnetic gap of this magnetic circuit 58. The magnetic circuit 58 and the coil 57 together constitute a moving coil type linear motor (VCM: voice coil motor). A cover 59 covers the upper portion of the base plate 51.

Next, the magnetic disk apparatus having the construction described above will be explained. When the magnetic disk 50 is halted, the slider 40 stops is in contact with a retreat zone of the magnetic disk 50.

When the spindle motor 52 rotates the magnetic disk 50 at a high speed, the air flow generated by the revolution of the magnetic disk 50 causes the slider 40 to fly, with a very small gap, above the disk surface. when a current is allowed to flow through the coil 57 in this state, a thrust occurs in the coil 57 and the actuator 53 turns. In consequence, it becomes possible to move the head (slider 40) to a desired track of the magnetic disk 50 and to execute the read/write operation of the data.

As explained above, the present invention can improve the S/N ratio by improving crystallinity of the magnetic recording layer of the magnetic recording medium through the intermediate layer, and can accomplish high-density recording by improving thermal stability. The present invention can provide such a magnetic recording medium and a magnetic storage apparatus capable of higher density recording than conventional apparatuses.

What is claimed is:

1. A magnetic recording medium comprising an underlayer made of an anti-ferromagnetic material and a magnetic recording layer made of a magnetic material comprising cobalt as its principal component that are disposed in sequence on a non-magnetic substrate, wherein an intermediate layer made of a ferromagnetic material and having an hcp structure is further sandwiched between and in direct contact with said underlayer and said magnetic recording layer, said ferromagnetic material controlling the crystallinity, crystal orientation and grain size of said magnetic recording layer, said intermediate layer is magnetically coupled with said magnetic recording layer, and said underlayer produces an exchange interaction of the magnetization between the same and said intermediate layer.

2. A magnetic recording medium according to claim 1, wherein said intermediate layer has a saturation magnetization smaller than that of said magnetic recording layer.

3. A magnetic recording medium according to claim 1 or 2, wherein said intermediate layer has a two-layered structure in which a lower intermediate layer has a lower magnetism than that of an upper intermediate layer.

4. A magnetic recording medium according to claim 1 or 2, wherein at least one seed layer is further sandwiched between said non-magnetic substrate and said underlayer.

5. A method of producing a magnetic recording medium having an underlayer and a magnetic recording layer on a non-magnetic substrate, comprising the steps of:

forming said underlayer from an anti-ferromagnetic material on said non-magnetic substrate;

forming an intermediate layer directly on the underlayer from a ferromagnetic material having an hcp structure; and forming said magnetic recording layer directly on the intermediate layer from a magnetic material comprising cobalt as its principal component on said intermediate layer;

each of said films being formed by sputtering, in which said ferromagnetic material allows control of the crystallinity, crystal orientation and grain size of said magnetic recording layer, said intermediate layer is magnetically coupled with said magnetic recording layer, and said underlayer produces an exchange interaction of the magnetization between the same and said intermediate layer.

6. A method of producing a magnetic recording medium according to claim 5, wherein said intermediate layer has a saturation magnetization smaller than that of said magnetic recording layer.

7. A method of producing a magnetic recording medium according to claim 5 or 6, wherein said intermediate layer is formed as a two-layered structure in which a lower intermediate layer has a lower magnetism than that of an upper intermediate layer.

8. A method of producing a magnetic recording medium according to claim 5 or 6, wherein at least one seed layer is further sandwiched between said non-magnetic substrate and said underlayer.

9. A magnetic storage apparatus including a write head portion for writing information to a magnetic recording medium and a read head portion for reading said information from said magnetic recording medium, wherein said magnetic recording medium is the one that is produced by disposing, in sequence, an underlayer made of an anti-ferrommagnetic material, an intermediate layer made directly on the underlayer of a ferromagnetic material having an hcp structure and a magnetic recording layer made directly on the intermediate layer of a magnetic material comprising cobalt as its principal component on a non-magnetic substrate, and said read head portion is equipped with a magneto-resistive head, in which said ferromagnetic material allows control of the crystallinity, crystal orientation and grain size of said magnetic recording layer, said intermediate layer is magnetically coupled with said magnetic recording layer, and said underlayer produces an exchange interaction of the magnetization between the same and said intermediate layer.

10. A magnetic storage apparatus according to claim 9, wherein said intermediate layer has a saturation magnetization smaller than that of said magnetic recording layer.

11. A magnetic storage apparatus according to claim 9 or 10, wherein said intermediate layer has a two-layered structure in which a lower intermediate layer has a lower magnetism than that of an upper intermediate layer.

12. A magnetic storage apparatus according to claim 9 or 10, wherein at least one seed layer is further sandwiched between said non-magnetic substrate and said underlayer.

* * * * *